United States Patent
Koo

(10) Patent No.: US 12,422,996 B2
(45) Date of Patent: Sep. 23, 2025

(54) CONTROLLER FOR CONTROLLING ONE-TIME PROGRAMMABLE MEMORY, SYSTEM, AND OPERATION METHOD THEREOF

(71) Applicant: SK hynix Inc., Icheon (KR)

(72) Inventor: Ja Hyun Koo, Icheon (KR)

(73) Assignee: SK hynix Inc., Icheon (KR)

( * ) Notice: Subject to any disclaimer, the term of this patent is extended or adjusted under 35 U.S.C. 154(b) by 437 days.

(21) Appl. No.: 18/045,753

(22) Filed: Oct. 11, 2022

(65) Prior Publication Data

US 2023/0376211 A1 Nov. 23, 2023

(30) Foreign Application Priority Data

May 19, 2022 (KR) .................. 10-2022-0061328

(51) Int. Cl.
*G06F 3/06* (2006.01)

(52) U.S. Cl.
CPC .......... *G06F 3/0614* (2013.01); *G06F 3/0644* (2013.01); *G06F 3/0679* (2013.01)

(58) Field of Classification Search
CPC .. G06F 3/0614; G06F 3/0644; G06F 13/1668; G06F 2212/1016; G06F 2212/7201; G06F 2212/7202; G06F 12/0238; G06F 2212/7204; G06F 3/0604; G06F 3/0653; G06F 12/0253; G06F 12/0292; G11C 2029/4402; G11C 17/16; G11C 17/18

USPC ..................................... 365/96, 200
See application file for complete search history.

(56) References Cited

U.S. PATENT DOCUMENTS

| | | | |
|---|---|---|---|
| 11,056,207 B2 | 7/2021 | Mori | |
| 2004/0205314 A1* | 10/2004 | Babudri | G06F 12/1425 |
| | | | 711/E12.099 |
| 2007/0157000 A1* | 7/2007 | Qawami | G11C 16/22 |
| | | | 711/170 |
| 2012/0066437 A1* | 3/2012 | Chen | G11C 16/102 |
| | | | 711/E12.008 |
| 2017/0270323 A1* | 9/2017 | Butler | G06K 19/07749 |
| 2022/0238171 A1* | 7/2022 | Chung | G11C 13/003 |
| 2022/0358982 A1* | 11/2022 | Williams | G11C 17/18 |
| 2022/0365843 A1* | 11/2022 | Li | G06F 11/1004 |
| 2023/0317187 A1* | 10/2023 | Lindskog | G11C 17/146 |
| | | | 365/96 |

FOREIGN PATENT DOCUMENTS

| KR | 1020140029090 A | 3/2014 |
|---|---|---|
| KR | 1020150019442 A | 2/2015 |

* cited by examiner

*Primary Examiner* — Michael T Tran

(57) ABSTRACT

A controller includes an e-fuse memory including a plurality of e-fuse memory cells and a control device. Such a control device may group the plurality of e-fuse memory cells into a plurality of e-fuse segments each having a given size, and set a plurality of e-fuse flags. Each of the plurality of e-fuse flags indicates whether data is programmed in a respective one of the plurality of e-fuse segment.

17 Claims, 11 Drawing Sheets

CONTROLLER FOR CONTROLLING ONE-TIME PROGRAMMABLE MEMORY, SYSTEM, AND OPERATION METHOD THEREOF

CROSS-REFERENCES TO RELATED APPLICATION

The present application claims priority under 35 U.S.C. 119(a) to Korean patent application number 10-2022-0061328 filed on May 19, 2022, which are incorporated herein by reference in its entirety.

TECHNICAL FIELD

Embodiments of the present disclosure relate to a controller for controlling a one-time programmable (OTP) memory (e.g., e-fuse memory), a memory system including the OTP memory, and an operating method thereof.

BACKGROUND

A memory system includes a data storage device that stores data on the basis of a request from a host, such as a computer, servers, a smartphone, a tablet PC, or other electronic devices. Some examples of the memory system span from a traditional magnetic-disk-based hard disk drive (HDD) to a semiconductor-based data storage device such as a solid state drive (SSD), a universal flash storage (UFS) device, or an embedded MMC (eMMC) device.

The memory system may further include a memory controller for controlling a memory device. The memory controller may receive a command from the host and, on the basis of the received command, may execute the command or control read/write/erase operations on the memory devices in the memory system. The memory controller may be used to execute firmware operations for performing a logical operation for controlling such operations.

Meanwhile, the memory controller may include an e-fuse memory. When data is programmed to a specific location in the e-fuse memory, the data cannot be changed any more.

SUMMARY

Embodiments of the present disclosure may provide a controller and operating method thereof, wherein there is no need to pre-program initial value in an OTP memory (e.g., an e-fuse memory) if there is no need to replace the initial value.

Also, embodiments of the present disclosure may provide a controller and operating method thereof, capable of addressing an issue that the entire e-fuse memory cannot be used if incorrect data is programmed into the e-fuse memory.

In one aspect, an embodiment of the present disclosure may provide a controller including i) an e-fuse memory including a plurality of e-fuse memory cells and ii) a control device configured to group the plurality of e-fuse memory cells into a plurality of e-fuse segments each having a given size, and set a plurality of e-fuse flags, each of the plurality of e-fuse flags indicating whether data is programmed in a respective one of the plurality of e-fuse segments.

In another aspect, an embodiment of the present disclosure may provide an operating method of the controller including i) grouping a plurality of e-fuse memory cells included in a e-fuse memory into a plurality of e-fuse segments each having a given size and ii) setting a plurality of e-fuse flags, each of the plurality of e-fuse flags indicating whether data is programmed in a respective one of the plurality of e-fuse segments.

In another aspect, an embodiment of the present disclosure may prove a memory system including i) a memory device and ii) a controller configured to control the memory device.

The controller may include a one-time programmable (OTP) memory including a plurality of memory cells; and a control device configured to group the plurality of memory cells into a plurality of segments each having a given size and set a plurality of flags, each of the plurality of e-fuse flags indicating whether data is programmed in a respective one of the plurality of segments.

According to embodiments of the present disclosure, there is no need to pre-program initial value in the e-fuse memory if there is no need to replace the initial value.

Also, according to embodiments of the present disclosure, it is possible to address the issue that the entire e-fuse memory cannot be used if incorrect data is programmed into the e-fuse memory.

DETAIL DESCRIPTION OF THE EXEMPLARY EMBODIMENTS

Figure 1:
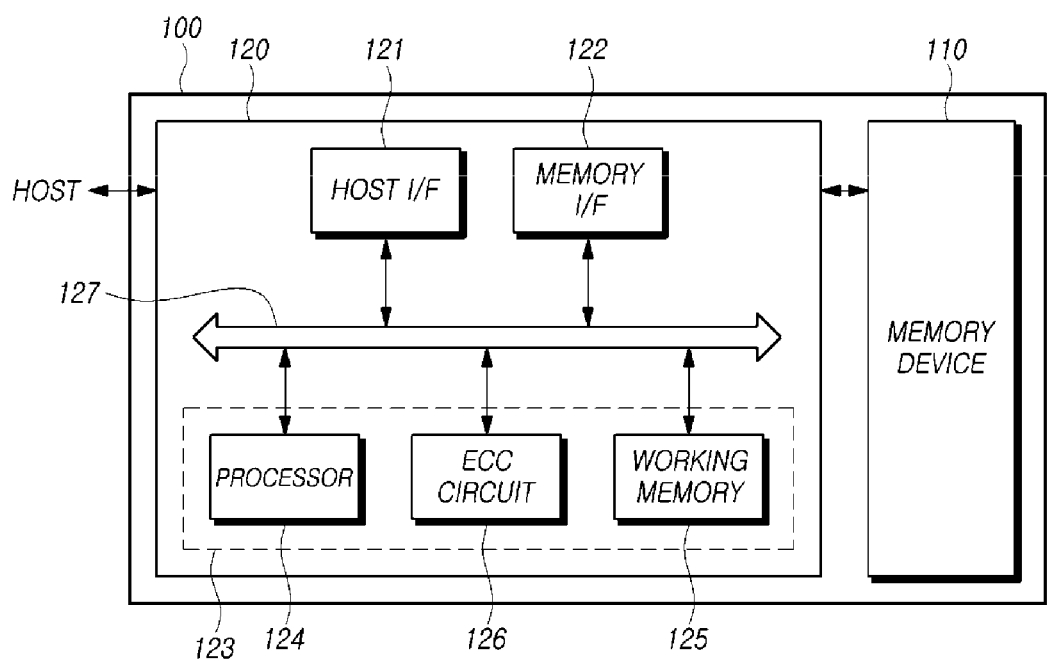
FIG. 1 is a schematic diagram illustrating a configuration of a memory system based on an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present disclosure are described below in more detail with reference to the accompanying drawings. We note, however, that embodiments of the present disclosure may be implemented in different forms and variations, and should not be construed as being limited to the embodiments set forth herein. Rather, the described embodiments are provided so that this disclosure will be thorough and complete. Throughout the disclosure, like reference numerals refer to like parts throughout the various figures and embodiments of the present disclosure.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers and other signal generating and signal processing features may include, for example, a memory or other storage device for storing code or instructions to be executed, for example, by a computer, processor, microprocessor, controller, or other signal processing device.

FIG. 1 is a diagram illustrating schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (SU-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs one or more background operations of the memory device 110.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface (memory I/F) 122, a control circuit 123, and a host interface (host I/F) 121.

The host interface 121 may be configured to provide an interface for communication with the host HOST.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The firmware refers to a program or software stored on a specific nonvolatile memory and is executed inside the memory system 100.

In some implementations, the firmware may include various functional layers. For example, the firmware may include one or more of a flash translation layer (FTL) configured to translate a logical address in the host requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In this patent document, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check as to whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
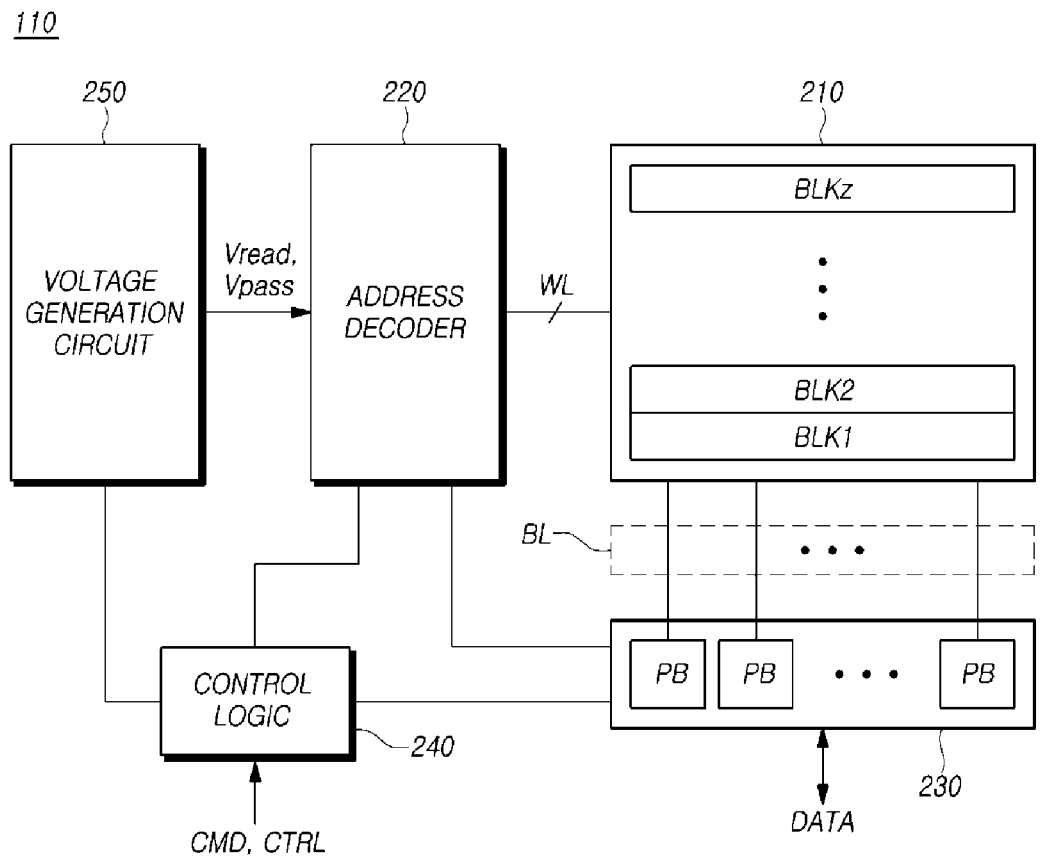
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include one or more of a block address, a row address, and a column address.

The address decoder 220 may select one memory block and one word line based on the block address and the row address. The column address may be decoded by the address decoder 220 and provided to the read/write circuit 230.

The address decoder 220 may include one or more of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

Figure 3:
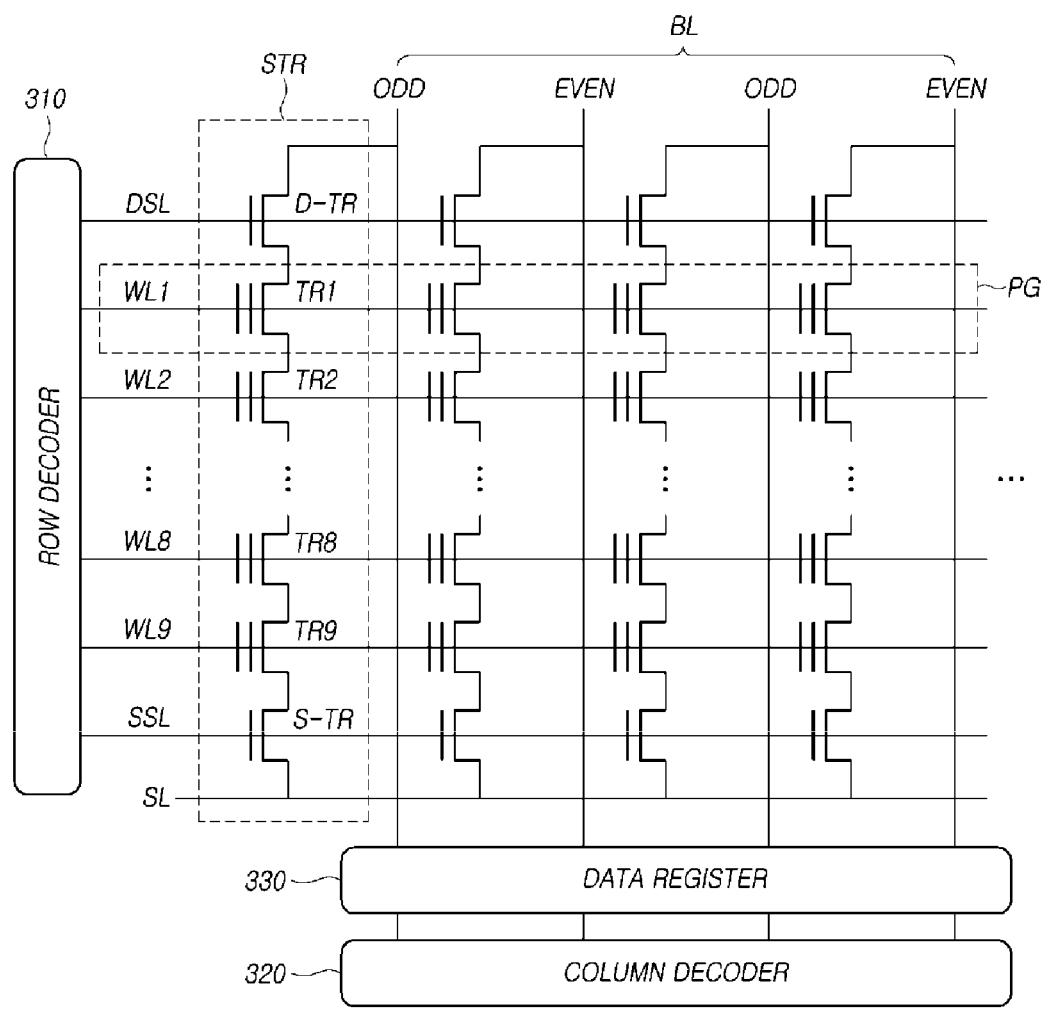
FIG. 3 is a diagram illustrating a structure of word lines and bit lines of a memory device based on an embodiment of the disclosed technology.

A memory block BLK included in the memory device 110 may include multiple pages (e.g., pages PG in FIG. 3). In some implementations, a plurality of memory cells arranged in columns form memory cell strings (e.g., memory cell strings STR in FIG. 3), and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

FIG. 3 is a diagram illustrating a structure of word lines WL and bit lines BL of a memory device (e.g., the memory device 110 in FIG. 2) based on an embodiment of the disclosed technology.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a relatively large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines ODD and even-numbered bit lines EVEN such that a pair of odd-numbered bit line ODD and even-numbered bit line EVEN is coupled in common to the column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch circuit that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
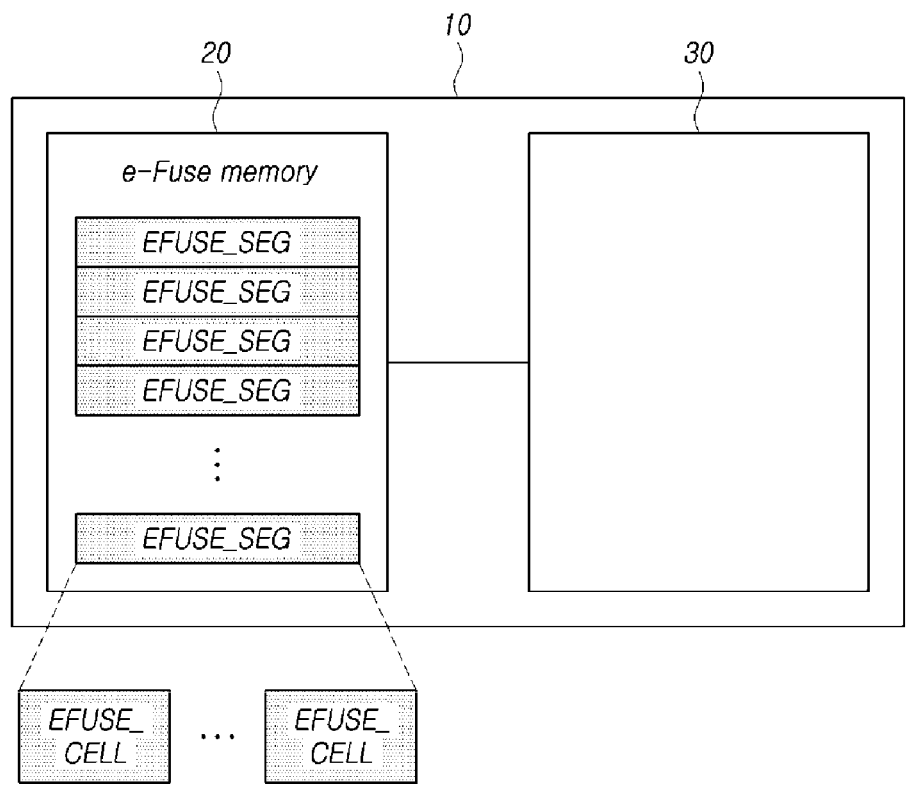
FIG. 4 illustrates a schematic structure of a controller according to embodiments of the present disclosure.

FIG. 4 illustrates a schematic structure of a controller 10 according to embodiments of the present disclosure.

Referring to FIG. 4, the controller 10 may include an e-fuse memory 20 and a control device 30. The controller 10 may include an OTP memory and the OTP memory may be the e-fuse memory 20.

The e-fuse memory 20 may include a plurality of e-fuse memory cells. An e-fuse memory cell has One Time Programmable (OTP) characteristic. Accordingly, once specific data is programmed into an e-fuse memory cell, the e-fuse memory cell cannot be modified and only a read operation may be performed on the e-fuse memory cell.

When a relatively high voltage is applied to the e-fuse memory cell, the fuse of the e-fuse memory cell may be blown. Data programmed in the e-fuse memory cell may represent binary information (0 or 1) according to whether the fuse of the e-fuse memory cell is blown or not.

For example, when a specific address is input to the e-fuse memory 20, the e-fuse memory 20 may output data stored in an e-fuse memory cell corresponding to the address.

The control device 30 may group the plurality of e-fuse memory cells included in the e-fuse memory 20 into a plurality of segments (e.g., e-fuse segments) EFUSE_SEG each having a given size. In an embodiment, a plurality of e-fuse segments EFUSE_SEG each may have a predetermined N-bits (e.g. 32 bits) size. Each of the e-fuse segments EFUSE_SEG may include one or more of the e-fuse memory cells.

In an embodiment, the N may be determined as an arbitrary natural number. For example, N may be 64, 32, or 16. The value of N may be a bit size of an address of a storage space (e.g. RAM, register) corresponding to the e-fuse memory 20 or a bit size of data.

The control device 30 may set a plurality of e-fuse flags for the plurality of e-fuse segments EFUSE_SEG. Setting a plurality of e-fuse flags for the plurality of e-fuse segments EFUSE_SEG according to an embodiment will be described below in detail with reference to FIG. 5.

Meanwhile, the controller 10 described with reference to FIG. 4 may be, for example, the memory controller 120 described with reference to FIG. 1 or a part of the memory controller 120. In this case, the control device 30 may be the control circuit 123 or the processor 124 described with reference to FIG. 1.

In this case, the controller 10 may replace an initial value of a specific register, for example, Special Function Register (SFR), among a plurality of registers (not shown) in the memory controller 120. For example, the controller 10 may replace an initial value of a register to be set before firmware operates during boot-up operation.

Figure 5:
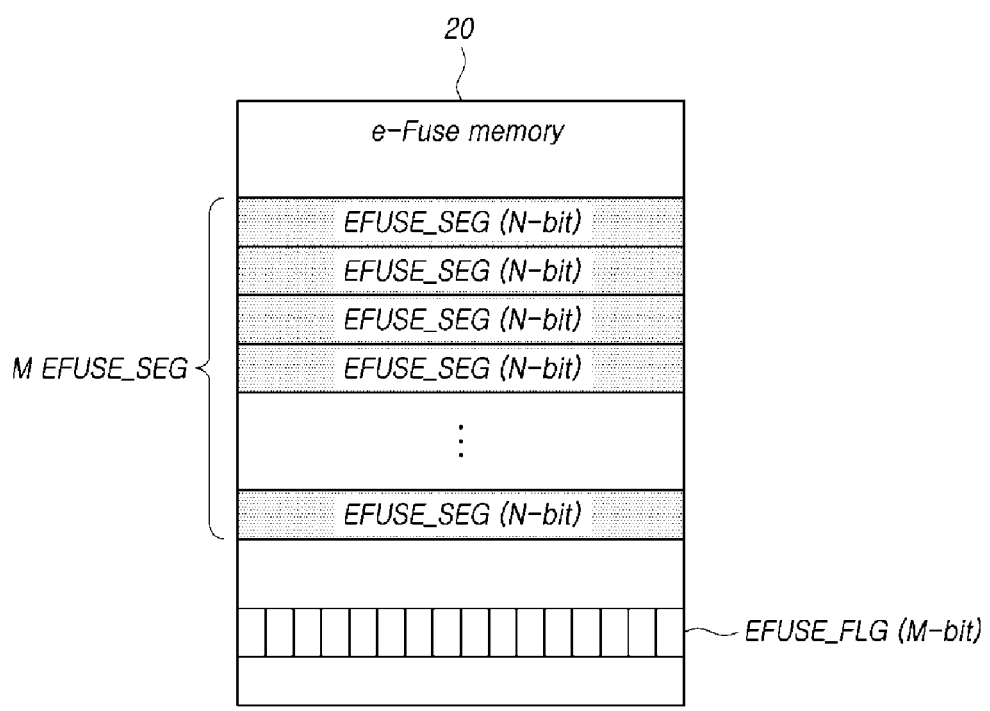
FIG. 5 illustrates structure of an e-fuse memory described in FIG. 4 according to an embodiment of the present disclosure.

FIG. 5 illustrates structure of the e-fuse memory 20 described in FIG. 4 according to an embodiment of the present disclosure.

Referring to FIG. 5, the e-fuse memory 20 may include M (M is a natural number greater than or equal to 2) e-fuse segments EFUSE_SEG and M e-fuse flags EFUSE_FLG.

Each of the e-fuse flags EFUSE_FLG may correspond to one of the M e-fuse segments EFUSE_SEG, and may indicate whether data is programmed into the corresponding e-fuse segment.

For example, each of the e-fuse flags EFUSE_FLG may be 1 bit, and the size of the M e-fuse flags EFUSE_FLG may be M bits.

The control device 30 may check whether data is programmed in a specific e-fuse segment EFUSE_SEG through whether an e-fuse flag corresponding to the specific e-fuse segment EFUSE_SEG is set. Through this, the control device 30 may, after reading data from the corresponding e-fuse segment EFUSE_SEG, determine whether to use the read data.

In embodiments of the present disclosure, data programmed in a specific e-fuse segment EFUSE_SEG may replace a value stored in a location (e.g. register) corresponding to the specific e-fuse segment EFUSE_SEG.

If it is uncertain whether or not data is programmed in the corresponding e-fuse segment EFUSE_SEG, the initial value stored in a specific location of the e-fuse memory 20 replaces the value stored in the corresponding location (e.g. register). Accordingly, an initial value for replacement should be programmed in the e-fuse memory 20.

However, in embodiments of the present disclosure, after first checking an e-fuse flag EFUSE_FLG corresponding to an e-fuse segment EFUSE_SEG, if the e-fuse flag EFUSE_FLG is not set, the control device 30 may not use the initial value stored in the corresponding e-fuse segment EFUSE_SEG to replace the value stored in the corresponding location. Accordingly, when the initial value does not need to be replaced, the initial value does not need to be programmed in the e-fuse memory 20 in advance.

Figure 6:
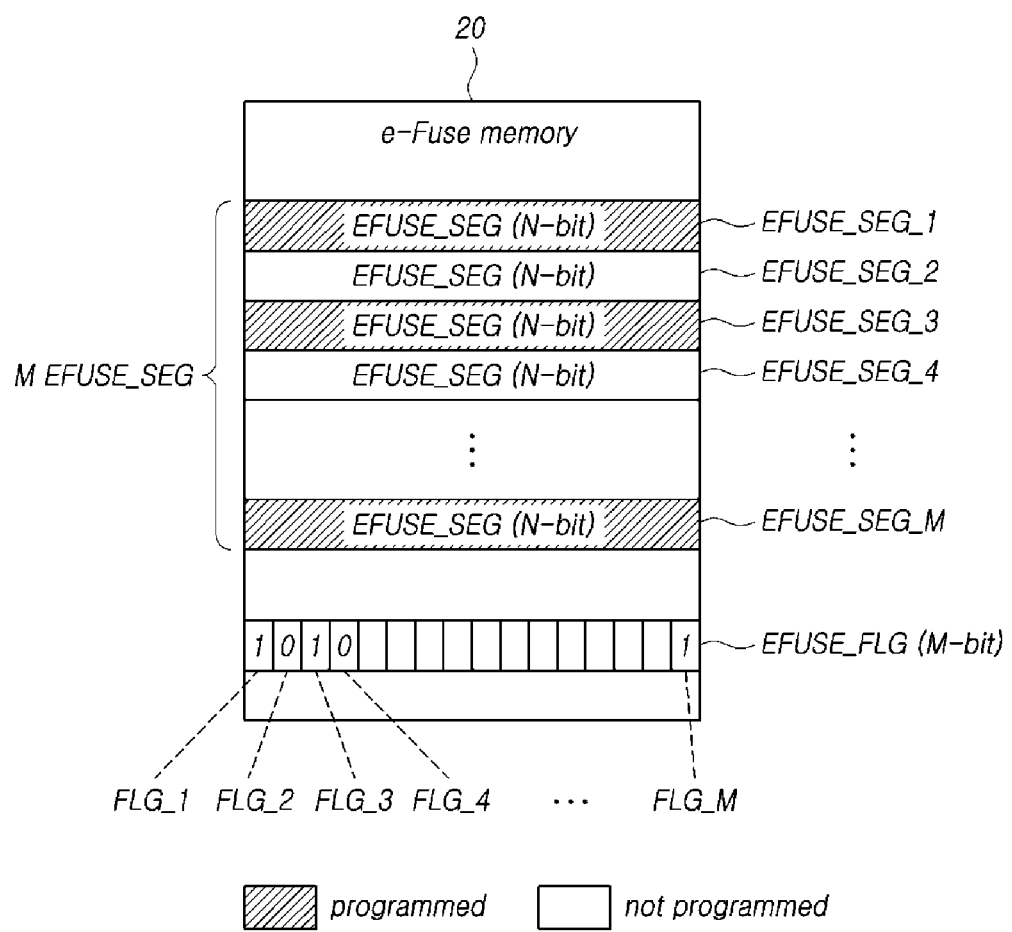
FIG. 6 illustrates a relationship between e-fuse segments and e-fuse flags in the e-fuse memory described in FIG. 5 according to embodiments of the present disclosure.

FIG. 6 illustrates a relationship between a plurality of segments (e.g., e-fuse segments) EFUSE_SEG and a plurality of flags (e.g., e-fuse flags) EFUSE_FLG in the e-fuse memory 20 described in FIG. 5 according to embodiments of the present disclosure.

Referring to FIG. 6, when data is programmed in a first segment (e.g., a first e-fuse segment) EFUSE_SEG_1 among the M e-fuse segments EFUSE_SEG, a first e-fuse flag FLG_1 corresponding to the first e-fuse segment EFUSE_SEG_1 is set. In the embodiment shown in FIG. 6, the first e-fuse flag FLG_1 may be set to have a first value of 1. However, embodiments of the present disclosure are not limited thereto, and a value indicating that an e-fuse flag EFUSE_FLG is set may not be limited to 1.

Meanwhile, since data is not programmed in a second segment (e.g., a second e-fuse segment) EFUSE_SEG_2 among the M e-fuse segments EFUSE_SEG, a second e-fuse flag FLG_2 corresponding to the second e-fuse segment EFUSE_SEG_2 is not set. In the embodiment shown in FIG. 6, the second e-fuse flag FLG_2 may have a second value of 0. However, a value indicating that an e-fuse flag EFUSE_FLG is not set may not be limited to 0.

Meanwhile, when data is programmed in a third segment (e.g., a third e-fuse segment) EFUSE_SEG_3 among the M e-fuse segments EFUSE_SEG, a third e-fuse flag FLG_3 corresponding to the third e-fuse segment EFUSE_SEG_3 is set to 1.

Meanwhile, since data is not programmed in a fourth segment (e.g., a fourth e-fuse segment) EFUSE_SEG_4 among the M e-fuse segments EFUSE_SEG, a fourth e-fuse flag FLG_4 corresponding to the fourth e-fuse segment EFUSE_SEG_4 is not set.

Similarly, when data is programmed in an M-th e-fuse segment EFUSE_SEG_M among the M e-fuse segments EFUSE_SEG, an M-th e-fuse flag FLG_M corresponding to the M-th e-fuse segment EFUSE_SEG_M is set to 1.

Figure 7:
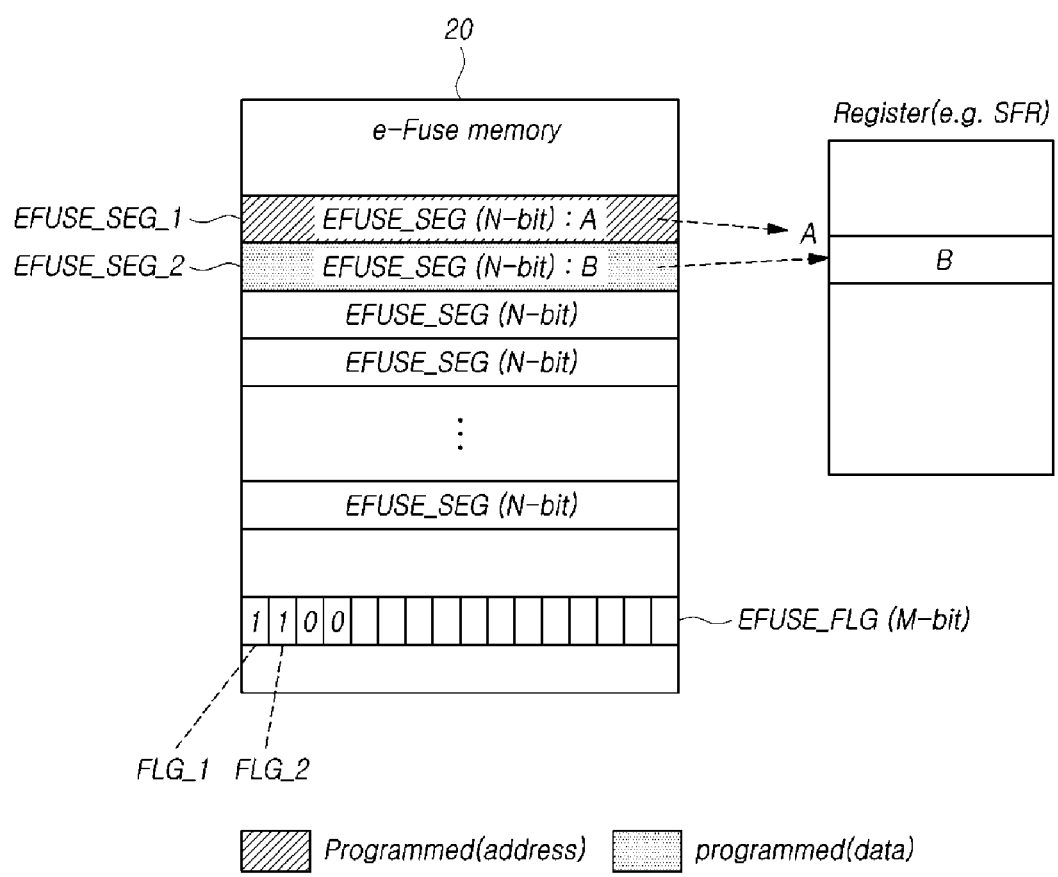
FIG. 7 illustrates data programmed into the e-fuse segments in the e-fuse memory described in FIG. 5 according to an embodiment of the present disclosure.

FIG. 7 illustrates data programmed into the e-fuse segments EFUSE_SEG in the e-fuse memory 20 described in FIG. 5 according to an embodiment of the present disclosure.

Referring to FIG. 7, a value of a target address A may be programmed in the first e-fuse segment EFUSE_SEG_1 among the plurality of e-fuse segments EFUSE_SEG included in the e-fuse memory 20. Meanwhile, an operation of programming the value of the target address A in the first e-fuse segment EFUSE_SEG_1 may be executed by the aforementioned control device 30.

For example, the target address A may be an address of a register (not shown) included in the controller 10 of FIG. 4. In an embodiment, the register may be SFR (Special Function Register). The SFR is a register that stores information for setting the operation of the controller 10. If the controller 10 is the aforementioned memory controller 120 in FIG. 1 or a part of the memory controller 120, the register may be included in the memory controller 120.

In addition, a value of data B to be stored in the location indicated by the target address A may be programmed in the second e-fuse segment EFUSE_SEG_2 among the plurality of e-fuse segments EFUSE_SEG. Specifically, the target address A may indicate a specific location (e.g., a register), and the data B may be stored in the specific location indicated by the target address A. Meanwhile, the operation of programming the value of data B to be stored in the location indicated by the target address A in the second e-fuse segment EFUSE_SEG_2 may be executed by the aforementioned control device.

When the value of the target address A is programmed into the first e-fuse segment EFUSE_SEG_1, the first e-fuse flag FLG_1 corresponding to the first e-fuse segment EFUSE_SEG_1 may be set.

When the value of data B to be stored in the location indicated by the target address A is programmed into the second e-fuse segment EFUSE_SEG_2, the second e-fuse flag FLG_2 corresponding to the second e-fuse segment EFUSE_SEG_2 may be set.

Meanwhile, the control device 30 may continuously program the first e-fuse segment EFUSE_SEG_1 and the second e-fuse segment EFUSE_SEG_2.

For example, the control device 30 may program the target address A in the first e-fuse segment EFUSE_SEG_1, and program data B to be stored in the location indicated by the target address A in the second e-fuse segment EFUSE_SEG_2 after programming the target address A in the first e-fuse segment EFUSE_SEG_1.

For another example, the control device 30 may program the target address A in the first e-fuse segment EFUSE_SEG_1, and program data B to be stored in the location indicated by the target address A in the second e-fuse segment EFUSE_SEG_2 substantially simultaneously.

In embodiments of the present disclosure, the control device 30 may determine whether the target address A is programmed in the first e-fuse segment EFUSE_SEG_1 and whether the data B to be stored in the location indicated by the target address A is programmed in the second e-fuse segment EFUSE_SEG_2 based on whether the first e-fuse flag FLG_1 and the second e-fuse flag FLG_2 are set, respectively.

For example, when the target address A is programmed in the first e-fuse segment EFUSE_SEG_1 and the data B to be stored in the location indicated by the target address A is programmed in the second e-fuse segment EFUSE_SEG_2, the control device 30 may program the data B in the location indicated by the target address A. Specifically, when the first and second e-fuse flags FLG_1 and FLG_2 are set to determine that the target address A is programmed in the first e-fuse segment EFUSE_SEG_1 and the data B is programmed in the second e-fuse segment EFUSE_SEG_2, respectively, the control device 30 may program the data B in the location indicated by the target address A.

For another example, when the target address A is programmed in the first e-fuse segment EFUSE_SEG_1 but the data B to be stored in the location indicated by the target address A is not programmed in the second e-fuse segment EFUSE_SEG_2, the control device 30 may not program the data B in the location indicated by the target address A. Instead, the control device 30 may program the data B to be stored in the target address A into the e-fuse memory 20, for example, into the second e-fuse segment EFUSE_SEG_2.

For another example, when the target address A is not programmed in the first e-fuse segment EFUSE_SEG_1 and the data B to be stored in the location indicated by the target address A is not programmed in the second e-fuse segment EFUSE_SEG_2, the control device 30 may not program the data B in the location indicated by the target address A. Instead, the control device 30 may program the target address A and the data B to be stored in the target address A into the e-fuse memory 20, for example, into the first e-fuse segment EFUSE_SEG_1 and the second e-fuse segment EFUSE_SEG_2, respectively.

Figure 8:
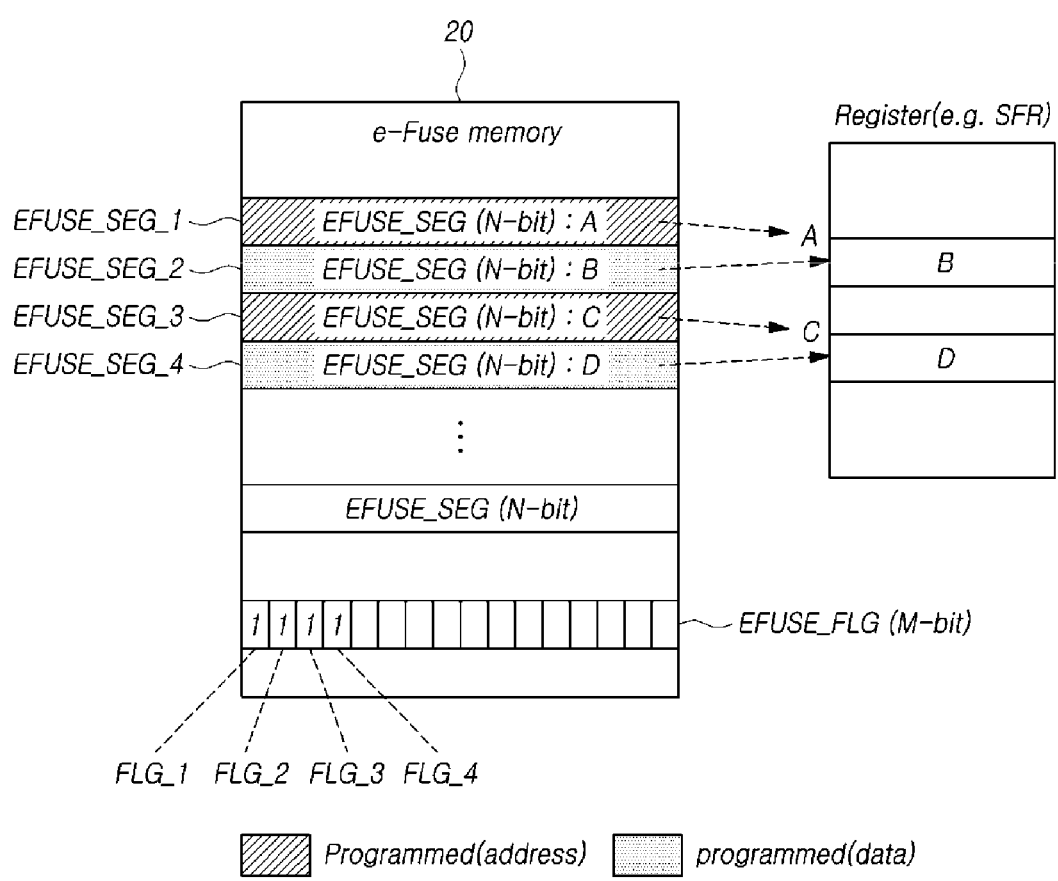
FIG. 8 illustrates how data is programmed into the e-fuse segments in the e-fuse memory described in FIG. 5 according to an embodiment of the present disclosure.

FIG. 8 illustrates how data is programmed into the e-fuse segments EFUSE_SEG in the e-fuse memory 20 of FIG. 5 according to an embodiment of the present disclosure.

Referring to FIG. 8, the first e-fuse segment EFUSE_SEG_1 storing the target address A and the second e-fuse segment EFUSE_SEG_2 storing the data B to be stored in the location indicated by the target address A may be adjacent to each other in the e-fuse memory 20.

If the first e-fuse segment EFUSE_SEG_1 and the second e-fuse segment EFUSE_SEG_2 are adjacent to each other, the address of the first e-fuse segment EFUSE_SEG_1 and the address of the second e-fuse segment EFUSE_SEG_2 may be continuous with each other in the e-fuse memory 20. In other words, the first e-fuse segment EFUSE_SEG_1 and the second e-fuse segment EFUSE_SEG_2 may be adjacent to each other without having any e-fuse segment therebetween.

The control device 30 may determine the first e-fuse segment EFUSE_SEG_1 and the second e-fuse segment EFUSE_SEG_2 so that the first e-fuse segment EFUSE_SEG_1 and the second e-fuse segment EFUSE_SEG_2 are adjacent to each other in the e-fuse memory 20. In other words, the control device 30 may determine the first e-fuse segment EFUSE_SEG_1 and the second e-fuse segment EFUSE_SEG_2 to provide the first e-fuse segment EFUSE_SEG_1 and the second e-fuse segment EFUSE_SEG_2 that are adjacent to each other in the e-fuse memory 20.

Referring to FIG. 8, the target address A may be programmed into the first e-fuse segment EFUSE_SEG_1, and the data B to be stored in the location indicated by the target address A may be programmed into the second e-fuse segment EFUSE_SEG_2, which is adjacent to the first e-fuse segment EFUSE_SEG_1. In this case, the first e-fuse flag FLG_1 corresponding to the first e-fuse segment EFUSE_SEG_1 and the second e-fuse flag FLG_2 corresponding to the second e-fuse segment EFUSE_SEG_2 may be set.

Similarly, an address C may be programmed into a third e-fuse segment EFUSE_SEG_3, and data D to be stored in the location indicated by the address C may be programmed into a fourth e-fuse segment EFUSE_SEG_4, which is adjacent to the third e-fuse segment EFUSE_SEG_3. In this case, a third e-fuse flag FLG_3 corresponding to the third e-fuse segment EFUSE_SEG_3 and a fourth e-fuse flag FLG_4 corresponding to the fourth e-fuse segment EFUSE_SEG_4 may be set.

Meanwhile, in FIG. 8, a case where the target address A and the address C are different from each other has been described as an example, but the address C may be the same as the target address A. In this case, the control device 30 may first program the data B to the target address A, and then overwrite the data D to the target address A. Through this, the control device 30 may write data to the same address in duplicate.

For example, the value stored in the second e-fuse segment EFUSE_SEG_2, that is, the data B to be stored in the location indicated by the target address A, may be incorrect or need to be corrected. As such, when an error occurs in the value stored in the second e-fuse segment EFUSE_SEG_2, the control device 30 may read the address C, which is same as the target address A, and read the data D corresponding thereto, and then the control device 30 may program the data D into the target address A.

Through this, even when incorrect data is programmed in the e-fuse memory 20, the control device 30 may address the issue that the e-fuse memory 20 cannot be used due to the incorrect data. This is because, even when incorrect data is programmed in the e-fuse memory 20, the control device 30 may program the same address as the address to which the incorrect data is written to the e-fuse memory 20 in duplicate and program normal data again in the e-fuse memory 20. Specifically, assuming that the data B having been stored in a specific location (e.g., register) includes one or more errors whereas the data D to be stored in the specific location does not include any error, the control device 30 may replace the data B with the data D. As a result, a device including a controller with a control device and an e-fuse memory according to an embodiment of the present disclosure may function normally, even when the e-fuse memory has been programmed to include incorrect data (e.g., the data B), by replacing the incorrect data with normal data (e.g., the data D). In contrast, when a conventional e-fuse memory has been programmed to include incorrect data, One Time Programmable (OTP) characteristic of the e-fuse memory would make a device including the conventional e-fuse memory malfunction. Accordingly, implementing devices each including a control device and an e-fuse memory according to an embodiment of the present disclosure can increase yield of these chips and save manufacturing cost of the chips.

An operation in which data is programmed into the plurality of e-fuse segments EFUSE_SEG included in the e-fuse memory 20 has been described above.

Hereinafter, an example of a boot-up operation performed by the controller 10 based on data programmed in the plurality of e-fuse segments EFUSE_SEG will be described with reference to a flowchart.

Figure 9:
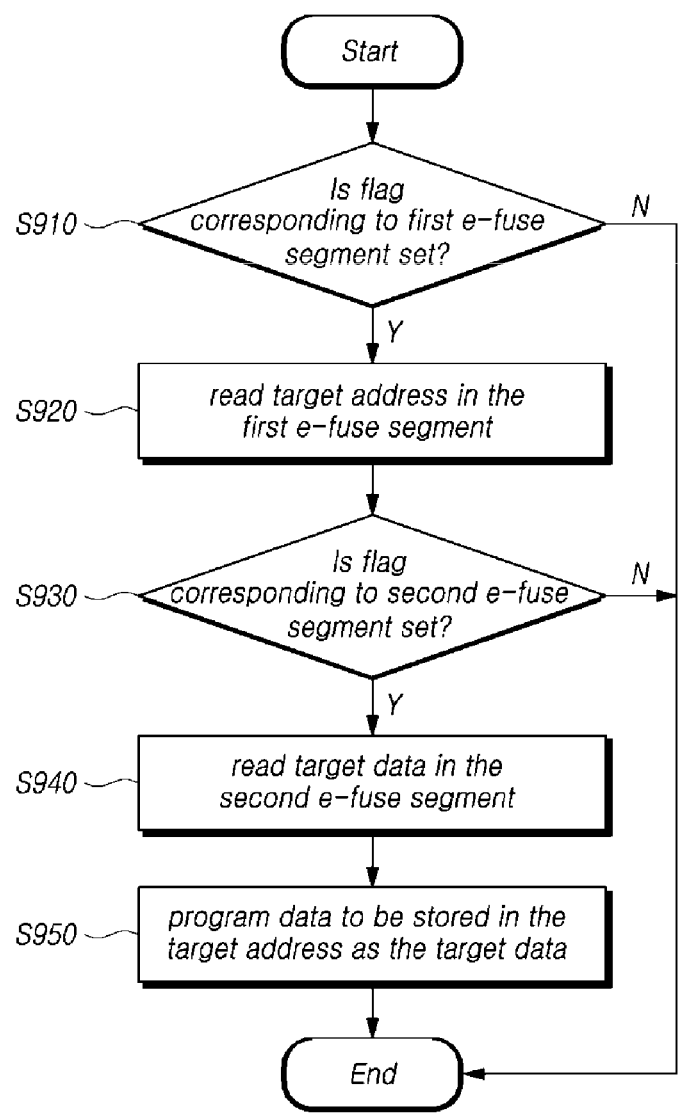
FIG. 9 illustrates a flowchart showing a boot-up operation of a controller according to an embodiment of the present disclosure.

FIG. 9 illustrates a flowchart showing a boot-up operation of the controller 10 according to an embodiment of the present disclosure.

Referring to FIG. 9, the control device 30 of the controller 10 may determine whether a first flag (e.g., the first e-fuse flag FLG_1) corresponding to the first e-fuse segment EFUSE_SEG_1 is set (S910).

When the first flag corresponding to the first e-fuse segment EFUSE_SEG_1 is set (S910-Y), the control device 30 may read a target address stored in the first e-fuse segment EFUSE_SEG_1 (S920). On the other hand, when the first flag corresponding to the first e-fuse segment EFUSE_SEG_1 is not set (S910-N), the control device 30 may finish the boot-up operation without executing additional operation.

Subsequently, the control device 30 may determine whether a second flag (e.g., the second e-fuse flag FLG_2) corresponding to the second e-fuse segment EFUSE_SEG_2 is set (S930).

When the second flag corresponding to the second e-fuse segment EFUSE_SEG_2 is set (S930-Y), the control device 30 may read target data stored in the second e-fuse segment EFUSE_SEG_2 (S940). On the other hand, when the second flag corresponding to the second e-fuse segment EFUSE_SEG_2 is not set (S930-N), the control device 30 may finish the boot-up operation without executing additional operation.

The control device 30 may program the data to be stored in the target address read in operation S920 as the target data read in operation S940 (S950). For example, at S950, the control device 30 may program the target data into a specific location (e.g., SFR) indicated by the target address.

Figure 10:
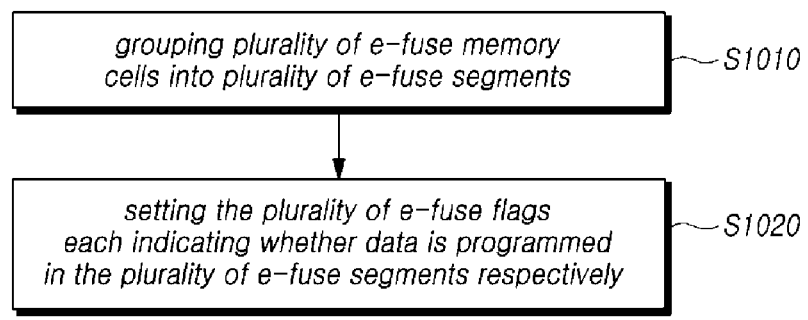
FIG. 10 illustrates an operating method of a controller according to embodiments of the present disclosure.

FIG. 10 illustrates an operating method of the controller 10 according to embodiments of the present disclosure.

Referring to FIG. 10, the operating method of the controller 10 may include grouping the plurality of e-fuse memory cells included in the e-fuse memory 20 into the plurality of e-fuse segments EFUSE_SEG each having N-bits size (S1010).

In this case, the e-fuse memory 20 may include the plurality of e-fuse flags EFUSE_FLG.

And the operating method of the controller 10 may include setting the plurality of e-fuse flags EFUSE_FLG, each of the plurality of e-fuse flags EFUSE_FLG indicating whether data is programmed in a respective one of the plurality of e-fuse segments EFUSE_SEG (S1020).

The operating method of the controller 10 may further include programming the target address in the first e-fuse segment EFUSE_SEG_1 among the plurality of e-fuse segments EFUSE_SEG and programming data to be stored in the location indicated by the target address in the second e-fuse segment EFUSE_SEG_2 among the plurality of e-fuse segments EFUSE_SEG.

In this case, the target address may indicate SFR (Special Function Register).

Meanwhile, the first e-fuse segment EFUSE_SEG_1 and the second e-fuse segment EFUSE_SEG_2 may be adjacent to each other in the e-fuse memory 20.

The operating method of the controller 10 may further include programming the data to be stored in the location indicated by the target address stored in the first e-fuse segment EFUSE_SEG_1 as target data stored in the second e-fuse segment EFUSE_SEG_2 when the e-fuse flag corresponding to the first e-fuse segment EFUSE_SEG_1 and the e-fuse flag corresponding to the second e-fuse segment EFUSE_SEG_2 among the plurality of e-fuse flags EFUSE_FLG are set during a boot-up operation. For example, in a boot-up operation, when a first e-fuse flag corresponding to the first e-fuse segment EFUSE_SEG_1 and a second e-fuse flag corresponding to the second e-fuse segment EFUSE_SEG_2 are set, the operating method of the controller 10 may further include programming target data into a specific location (e.g., SFR), the target data being stored in the second e-fuse segment EFUSE_SEG_2 and the specific location being indicated by a target address stored in the first e-fuse segment EFUSE_SEG_1.

Figure 11:
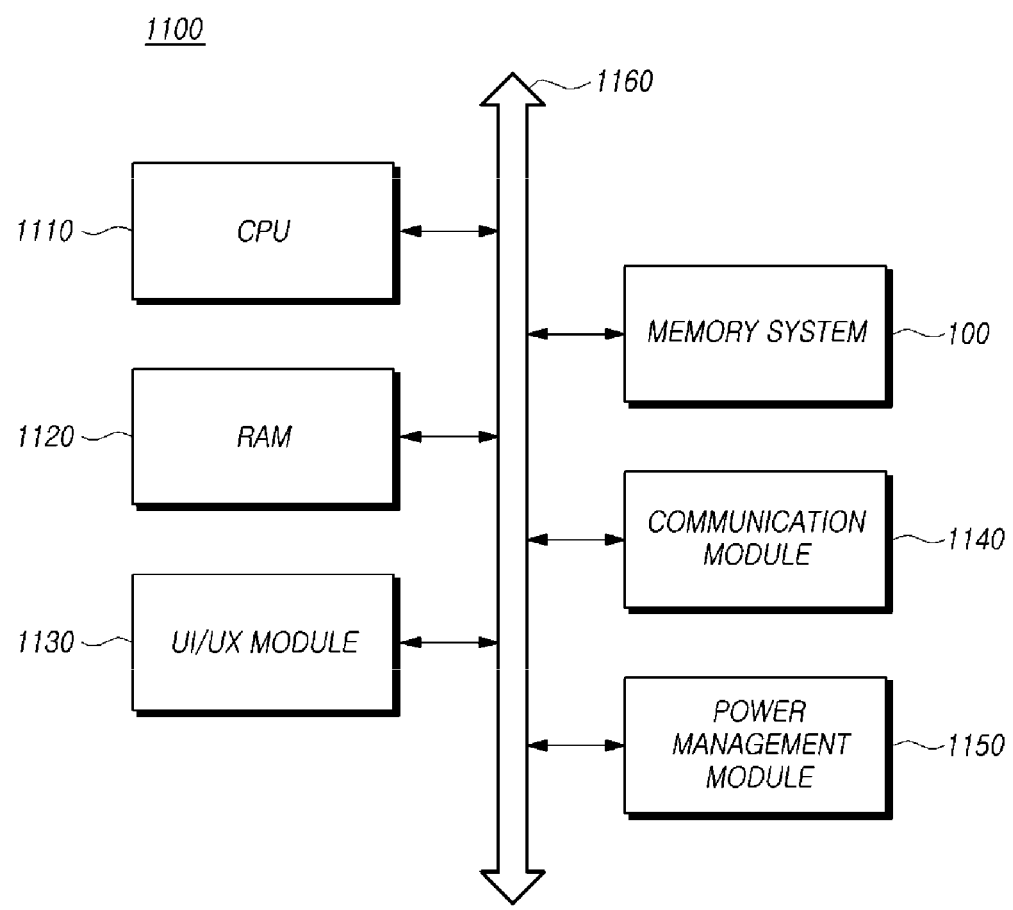
FIG. 11 is a diagram illustrating a computing system based on some embodiments of the disclosed technology.

FIG. 11 is a diagram illustrating a computing system 1100 based on an embodiment of the disclosed technology.

Referring to FIG. 11, the computing system 1100 based on an embodiment of the disclosed technology may include: a memory system 100 electrically connected to a system bus 1160; a CPU 1110 configured to control the overall operation of the computing system 1100; a RAM 1120 configured to store data and information related to operations of the computing system 1100; a user interface/user experience (UI/UX) module 1130 configured to provide the user with a user environment; a communication module 1140 configured to communicate with an external device as a wired and/or wireless type; and a power management module 1150 configured to manage power used by the computing system 1100.

The computing system 1100 may be a personal computer (PC) or may include a mobile terminal such as a smartphone, a tablet or various electronic devices.

The computing system 1100 may further include a battery for supplying an operating voltage, and may further include an application chipset, a graphic-related module, a camera image processor, and a DRAM.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Although various embodiments of the disclosed technology have been described with particular specifics and varying details for illustrative purposes, those skilled in the art will appreciate that various modifications, additions and substitutions may be made based on what is disclosed or illustrated in the present disclosure.

What is claimed is:

1. A controller comprising:
   an e-fuse memory including a plurality of e-fuse memory cells; and
   a control device configured to:
   group the plurality of e-fuse memory cells into a plurality of e-fuse segments each having a given size; and
   set a plurality of e-fuse flags, each of the plurality of e-fuse flags indicating whether data is programmed in a respective one of the plurality of e-fuse segments,
   wherein the plurality of e-fuse segments include a first e-fuse segment and a second e-fuse segment, and
   wherein the control device is further configured to:
   program a target address into the first e-fuse segment; and
   program data to be stored in a specific location into the second e-fuse segment to store the programmed data as target data, the specific location being indicated by the target address.

2. The controller of claim 1, wherein the e-fuse memory further includes the plurality of e-fuse flags.

3. The controller of claim 1, wherein the target address indicates an SFR (Special Function Register).

4. The controller of claim 1, wherein the control device is further configured to:
   determine the first e-fuse segment and the second e-fuse segment to provide the first e-fuse segment and the second e-fuse segment that are adjacent to each other in the e-fuse memory.

5. The controller of claim 1, wherein the control device is further configured to:
   program the target data into the specific location, when a first e-fuse flag corresponding to the first e-fuse segment and a second e-fuse flag corresponding to the second e-fuse segment are set during a boot-up operation.

6. The controller of claim 1, wherein the plurality of e-fuse segments further include a third e-fuse segment and a fourth e-fuse segment, and
   wherein the control device is further configured to:
   program the target address into the third e-fuse segment and program the data to be stored in the location into the fourth e-fuse segment, when an error occurs in the target data stored in the second e-fuse segment.

7. An operating method of a controller, the operating method comprising:
   grouping a plurality of e-fuse memory cells included in an e-fuse memory into a plurality of e-fuse segments each having a given size; and
   setting a plurality of e-fuse flags, each of the plurality of e-fuse flags indicating whether data is programmed in a respective one of the plurality of e-fuse segments,
   wherein the plurality of e-fuse segments include a first e-fuse segment and a second e-fuse segment, the method further comprising:
   programming a target address into the first e-fuse segment; and
   programming data to be stored in a specific location into the second e-fuse segment to store the programmed data as target data, the specific location being indicated by the target address.

8. The operating method of claim 7, wherein the e-fuse memory further includes the plurality of e-fuse flags.

9. The operating method of claim 7, wherein the target address indicates an SFR (Special Function Register).

10. The operating method of claim 7, further comprising determining the first e-fuse segment and the second e-fuse segment to provide the first e-fuse segment and the second e-fuse segment that are adjacent to each other in the e-fuse memory.

11. The operating method of claim 7, further comprising:
    programming the target data into the specific location, when a first e-fuse flag corresponding to the first e-fuse segment and a second e-fuse flag corresponding to the second e-fuse segment are set during a boot-up operation.

12. The operating method of claim 7, wherein the plurality of e-fuse segments further include a third e-fuse segment and a fourth e-fuse segment, the method further comprising:
    programming the target address into the third e-fuse segment and program the data to be stored in the location into the fourth e-fuse segment, when an error occurs in the target data stored in the second e-fuse segment.

13. A memory system comprising:
a memory device; and
a controller configured to control the memory device, wherein the controller includes:
  a one-time programmable (OTP) memory including a plurality of memory cells; and
  a control device configured to:
    group the plurality of memory cells into a plurality of segments each having a given size; and
    set a plurality of flags, each of the plurality of e-fuse flags indicating whether data is programmed in a respective one of the plurality of segments,
wherein the plurality of segments include a first segment and a second segment, and
wherein the control device is further configured to:
  program a target address into the first segment; and
  program data to be stored in a specific location into the second segment to store the programmed data as target data, the specific location being indicated by the target address.

14. The memory system of claim 13, wherein the OTP memory is an e-fuse memory.

15. The memory system of claim 13, wherein the given size of each of the plurality of segments is 64, 32, or 16 bits.

16. The controller of claim 13, wherein the control device is further configured to:
  program the target data into the specific location when a first flag corresponding to the first segment and a second flag corresponding to the second segment are set during a boot-up operation.

17. The controller of claim 13, wherein the plurality of segments further include a third segment and a fourth segment, and
wherein the control device is further configured to:
  program the target address into the third segment and program the data to be stored in the location into the fourth segment, when an error occurs in the target data stored in the second segment.

* * * * *